United States Patent

Tamai

[11] Patent Number: 5,917,238
[45] Date of Patent: Jun. 29, 1999

[54] LIQUID CRYSTAL DISPLAY DRIVER

[75] Inventor: Shigeki Tamai, Kashihara, Japan

[73] Assignee: Sharp Kabushiki Kaisha, Osaka, Japan

[21] Appl. No.: 08/552,622

[22] Filed: Nov. 3, 1995

[30] Foreign Application Priority Data

Mar. 24, 1995 [JP] Japan ..................... 7-065981

[51] Int. Cl.$^6$ ................... H01L 23/48

[52] U.S. Cl. ................... 257/690; 349/41

[58] Field of Search ............ 349/59, 41, 42, 349/54; 257/690, 691

[56] References Cited

U.S. PATENT DOCUMENTS 5,648,794  7/1997  Jelsma et al. ............... 349/41

*Primary Examiner*—Peter Toby Brown
*Assistant Examiner*—Roy Potter

[57] ABSTRACT

Power consumption in a liquid crystal display driver is reduced without degrading display quality of a liquid crystal display. Supply of unnecessary oscillation voltage to the liquid crystal display is stopped by turning off all analog switches $AS_0$–$AS_7$ under the control of a signal TI at the moment when voltage applied to the liquid crystal display reaches a desired DC voltage corresponding to display data $D_0$–$D_2$.

8 Claims, 11 Drawing Sheets

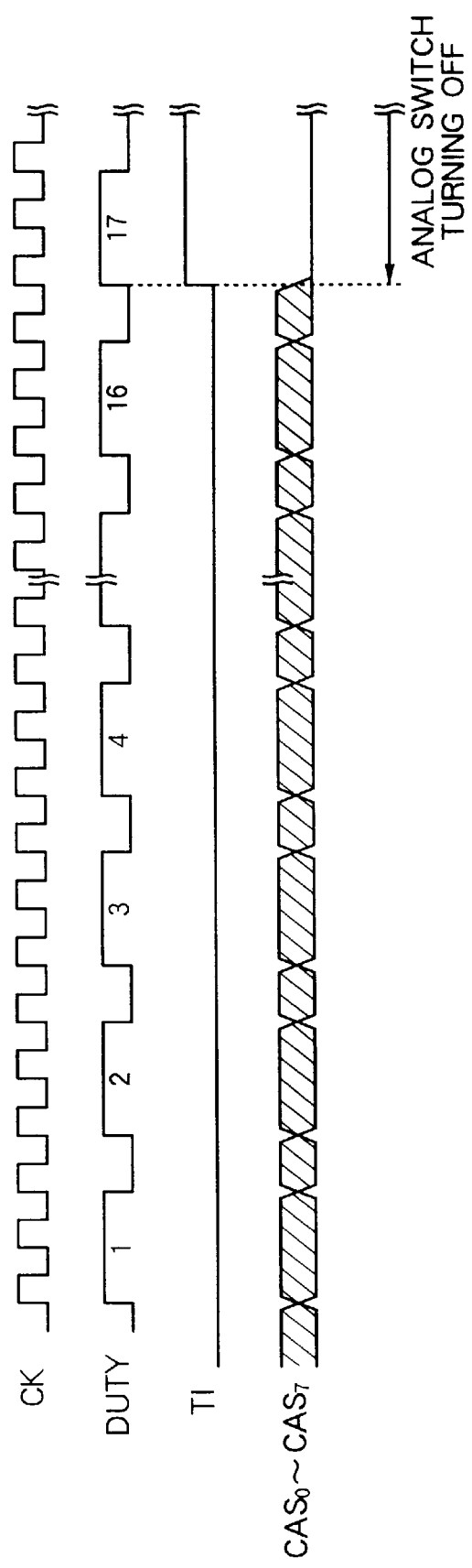

LIQUID CRYSTAL DISPLAY DRIVER

BACKGROUND OF THE INVENTION

1. Field of the Invention

The present invention relates to an improvement in a liquid crystal display driver for driving a liquid crystal display.

2. Description of the Related Art

The related art will be explained by taking a digital driving source driver for a TFT liquid crystal display as an example.

FIG. 2 is a diagram showing a TFT liquid crystal display 21, as well as a gate driver IC 22 and a source driver IC 23 which are the driver for the liquid crystal display. Each picture element of the TFT liquid crystal display 21 consists of a TFT (MOSFET) 211 and a liquid crystal element 212. The gate driver IC 22 sequentially outputs phase shifted gate driving pulses $G_1, \ldots, G_M$. In addition, the source driver IC 23 (8 gradation display) time divisionally (alternately) outputs to output terminals $O_1, \ldots, O_N$ one or two potentials selected from reference voltage $V_0, V_2, V_5$ and $V_7$ (being supplied from outside through terminals $T_0, T_2, T_5$ and $T_7$, respectively) according to display data $D_0, D_1$ and $D_2$ input from a display controller (not shown).

FIG. 3 shows an internal arrangement of the source driver IC 23. The circuit of FIG. 3 is a section corresponding to one output terminal, and the source driver IC has N similar circuits in parallel therein.

$D_0, D_1$, and $D_2$ are display data; $DM_0, DM_1$, and $DM_2$ are memory circuits which take in display data at timing of clock signal SRi (i=1, ..., N) and store them; $DL_0, DL_1$, and $DL_2$ are display latch circuits latching the output of a data memory circuit at the timing of horizontal synchronizing signal LS; $V_0, V_{2, V5\ and\ V7}$ are reference power supplies; $L_0, L_2, L_5$ and $L_7$ are supply lines of the reference power supplies $V_0, V_{2, V5}$ and $V_7$, respectively, $AS_0, AS_2, AS_5$ and $AS_7$ are analog switches inserted in respective power supply lines, Di is a decoder circuit which outputs signals $CAS_0, CAS_2, CAS_5$ and $CAS_7$ for controlling opening or closing of the analog switches $AS_0, AS_2, AS_5$ and $AS_7$ based on the outputs of the display latch circuits $DL_0, DL_1$, and $DL_2$, and a signal Duty with a duty ratio 1:2; and Oi is an output. The clock signals SRi are sequentially phase shifted timing signals output from a shift register contained in the source driver IC.

The waveform of the signal Duty with duty ratio 1:2 and its generator circuit are shown in FIGS. 4 and 5, respectively.

CK shown in FIG. 4 is a base clock. As shown in FIG. 5, the signal Duty is generated from the base clock CK and the horizontal synchronizing signal LS by using three D-type flip-flops $FF_1, FF_2$ and $FF_3$. The generator circuit for the signal Duty with duty ratio 1:2 is provided in the source driver IC. The relationship between the input display data $D_2, D_1$ and $D_0$, the output signals $CAS_0, CAS_2, CAS_5$ and $CAS_7$ of the decoder circuit Di, and output voltage values is shown in 1 below.

TABLE 1

| $D_2$ | $D_1$ | $D_0$ | $CAS_0$ | $CAS_2$ | $CAS_5$ | $CAS_7$ | Output value |
|---|---|---|---|---|---|---|---|
| 0 | 0 | 0 | 1 | 0 | 0 | 0 | $V_0$ |
| 0 | 0 | 1 | Duty | $\overline{\text{Duty}}$ | 0 | 0 | $\frac{V_0 + 2 \cdot V_2}{3}$ |
| 0 | 1 | 0 | 0 | 1 | 0 | 0 | $V_2$ |
| 0 | 1 | 1 | 0 | Duty | $\overline{\text{Duty}}$ | 0 | $\frac{2 \cdot V_2 + V_5}{3}$ |
| 1 | 0 | 0 | 0 | $\overline{\text{Duty}}$ | Duty | 0 | $\frac{V_2 + 2 \cdot V_5}{3}$ |
| 1 | 0 | 1 | 0 | 0 | 1 | 0 | $V_5$ |
| 1 | 1 | 0 | 0 | 0 | Duty | $\overline{\text{Duty}}$ | $\frac{2 \cdot V_5 + V_7}{3}$ |
| 1 | 1 | 1 | 0 | 0 | 0 | 1 | $V_7$ |

FIG. 6 shows an example of arrangement of the decoder circuit Di. It consists of a logical gate which generates and outputs the analog switch control signals $CAS_0, \ldots$ listed in Table 1 based on the signal Duty with duty ratio 1:2 and the display data $D_0, \ldots$ In addition, FIG. 7 shows an example of arrangement of the analog switch $AS_0$ and the like. Although the example of FIG. 7 is constituted by a CMOS transfer gate, it may be constituted by a transfer gate consisting of only a single channel MOS transistor for the channel not causing a threshold voltage drop. For example, $AS_0, AS_2$ and $AS_5$ may be constituted only by N-channel MOS transistors. In addition, $AS_2, AS_5$ and $AS_7$ may be constituted only by P-channel MOS transistors, by inverting the decoder output.

Now, the operation of the circuit in FIG. 3 will be explained by referring to a timing chart shown in FIG. 8.

As shown in FIG. 8, when the clock signal SRi controlling the data memory circuits $DM_0, \ldots$ is at a high level, 3-bit display data $D_0, D_1$, and $D_2$ are taken in the memory circuits, output from Q output as they are, and introduced to the display latch circuit $DL_0, \ldots$ When the signal SRi falls from the high level to a low level, the data memory circuits maintain the values of $D_0$–$D_2$, and each does not change its Q output even if the input display data $D_0$–$D_2$ change during the interval when the signal SRi is at the low level. Then, when the horizontal synchronizing signal LS controlling the display latch circuits $DL_0, \ldots$ is at the high level, the Q output of each of the data memory circuits $DM_0, \ldots$ is introduced to the Q output of the display latch circuit $DL_0, \ldots$ as it is. When the signal LS falls from the high level to the low level, the Q output of the display latch circuit holds the data of Q output of the data memory circuit at the moment. In addition, during the interval when the signal LS is at the low level, the Q output of each of the display latch circuit does not change even if the Q output of the data memory circuit changes. The Q output of the data latch circuits $DL_0, \ldots$ is introduced to the input of the decoder circuit Di. The decoder circuit Di outputs the analog switch control signal $CAS_0, \ldots$ as listed in Table 1 according to the content of input. For example, when $D_2, D_1$ and Do are "1000," the decoder circuit outputs a signal to turn on only the analog switch $AS_0$. This outputs the potential of the reference power supply $V_0$ at the output Oi which is supplied to the liquid crystal display. When $D_2, D_1$ and $D_0$ are "011," it outputs a signal which turns on the analog switch $AS_2$ for a duration of $\frac{2}{3}$, turns off the analog switch $AS_2$ for a subsequent duration of $\frac{1}{3}$ to turn on the analog switch $AS_5$, and alternately repeats this sequence. Thus, the potentials of reference power supplies $V_2$ and $V_5$ are alternately output to the output Oi in a temporal relationship of 2:1, and supplied to the liquid crystal display.

In FIG. 2, if, for example, the gate driver 22 is outputting the gate drive pulse $G_1$, the outputs $O_1, \ldots$ from the source driver 23 are applied to respective liquid crystal elements 212, . . . as DC voltage under a low pass filter effect according to wiring resistance of the source lines $SL_1$, . . . in the liquid crystal display 21, ON resistance of TFTs 211, . . . and wiring capacity of lines $SL_1$, . . . The voltage once applied to the respective liquid crystal elements is maintained by the capacity of liquid crystal element themselves. Similar operation is repeated every time when the gate drive pulses $G_2$, . . . , $G_M$ are output, and, after the gate drive pulse $G_M$ is output, the gate drive pulse $G_1$ is again output to repeat the similar operation.

It has been strongly demanded for battery-driven portable equipment such as a liquid crystal display to further extend the battery operation time, and to further reduce power consumption. For example, in a color TFT liquid crystal panel for a notebook personal computer, because 4 watts out of 6 watts are consumed by a backlight, and a remaining 2 watts are consumed by a liquid crystal driver or the like, it has been essential to further reduce power consumption.

The conventional liquid crystal display driver as described above time divisionally supplies the potentials of two adjacent reference power supplies to the liquid crystal display in the duty ratio according to the display data, and converts them into DC voltage by utilizing the low pass filter effect from the wiring resistance and wiring capacity of the liquid crystal display. Therefore, conventionally, the analog switches of the liquid crystal display driver are repeatedly turned on and off during one horizontal duration to apply oscillation voltage to the input of the low pass filter, and continues to apply the oscillation voltage even after the desired DC voltage is reached so that more oscillation voltage than necessary would be input. Then, the display quality of the liquid crystal display is improved beyond a range which can be visually observed, but unnecessary consumption current occurs.

SUMMARY OF THE INVENTION

The present invention is made in view of the above technical problems, and is intended to reduce the consumption of current while maintaining the display quality of the liquid crystal display.

The basic idea of the present invention is to stop the supply of the oscillation voltage at the moment when the voltage applied to the respective liquid crystal elements of the liquid crystal display reaches a desired DC voltage corresponding to the display data.

That is, the liquid crystal display driver of the present invention is a liquid crystal display driver which outputs, to a liquid crystal display, the potential of one reference power supply selected from a plurality of reference power supplies, continuously, according to display data. Alternatively, it outputs the potentials of at least two reference power supplies selected from the plurality of reference power supplies in a time divisional manner. The liquid crystal display driver comprises a plurality of input terminals to which the plurality of reference power supplies are connected, an output terminal connected to the liquid crystal display, analog switches inserted between the respective input terminals and the output terminal, and a control circuit outputting a control signal for controlling to be ON or OFF of the analog switches based on said display data, wherein the driver further comprises a counter circuit, and a circuit outputting a signal for turning off all analog switches based on a signal indicating that a content of counts in the counter circuit reaches a predetermined value.

In addition, the liquid crystal display driver of the present invention is a liquid crystal driver which alternately outputs, to a liquid crystal display, the potentials of two reference power supplies selected from a plurality of reference power supplies according to display data, the liquid crystal display driver comprising a plurality of input terminals to which the plurality of reference power supplies are connected, an output terminal connected to the liquid crystal display, analog switches inserted between the respective input terminals and the output terminal, and a control circuit outputting a control signal for alternately turning on two corresponding analog switches based on the display data, wherein the liquid crystal display driver further comprises a counter circuit counting a number of periodic repetitions when the two analog switches are alternately turned on, and a circuit outputting a signal for turning off all the analog switches based on a signal indicating that a content of counts in the counter circuit reaches a predetermined value.

Furthermore, the period of time until the voltage applied to the liquid crystal elements reaches the desired DC voltage varies depending on the characteristics or number of gradations of liquid crystal display. Accordingly, to meet such an arrangement, the time until the analog switches are turned off is variable. More particularly, the predetermined value is variable. In addition, the cycle of count clock signal in the counter circuit is variable.

The present invention can reduce the current consumption while maintaining the display quality of the liquid crystal display.

Further objects and advantages of the present invention will be apparent from the preferred embodiment of the invention as illustrated in the accompanying drawings.

BRIEF DESCRIPTION OF THE DRAWINGS

FIG. 11 includes waveforms of Duty signal and TI signal, as well as analog switch control signals $CAS_0$, . . . , $CAS_7$.

DESCRIPTION OF THE PREFERRED EMBODIMENTS

Now, the present invention will be explained in detail in accordance with an embodiment.

Figure 1:
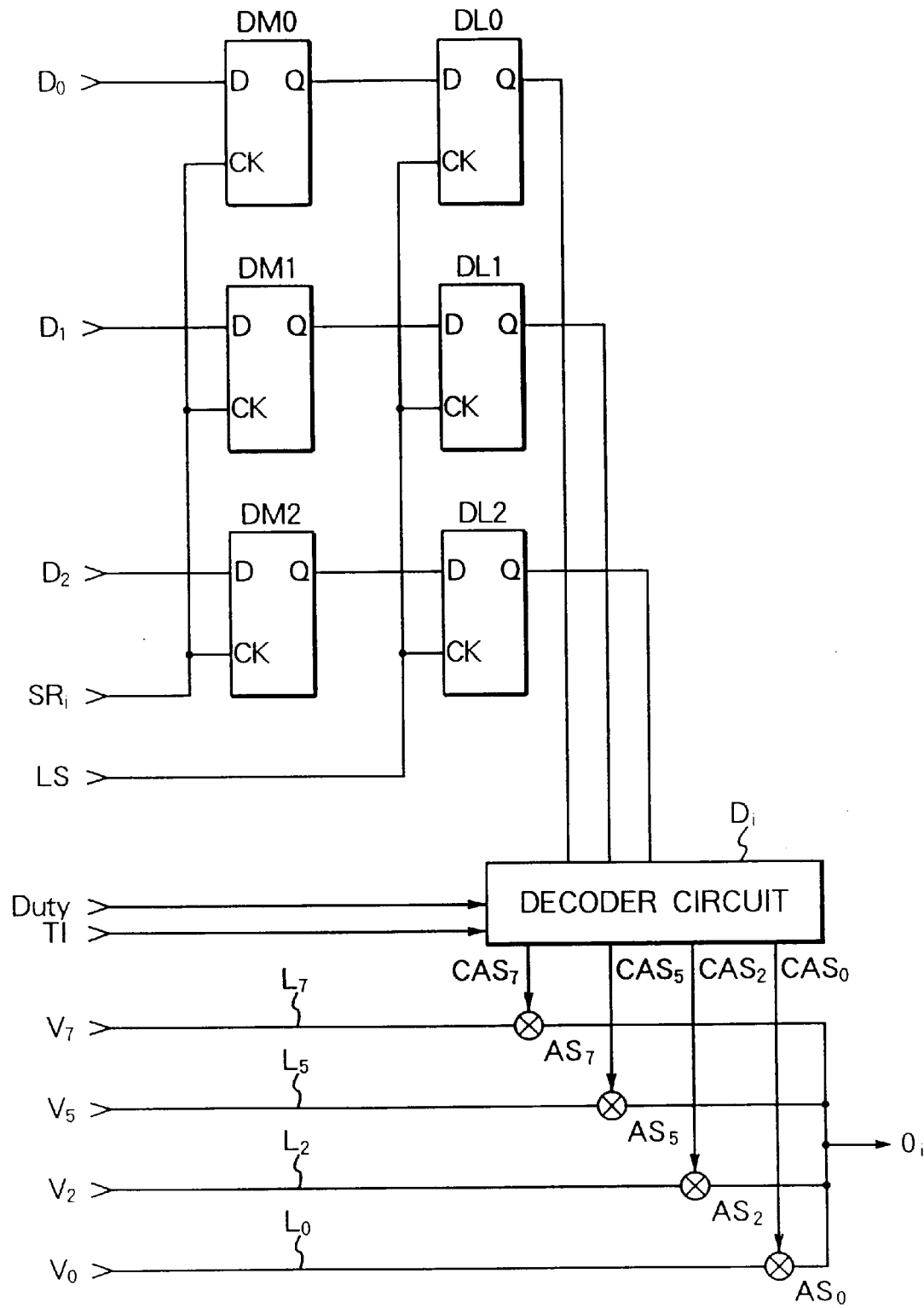
FIG. 1 is an internal arrangement of a source driver in an embodiment of the present invention.
Figure 2:
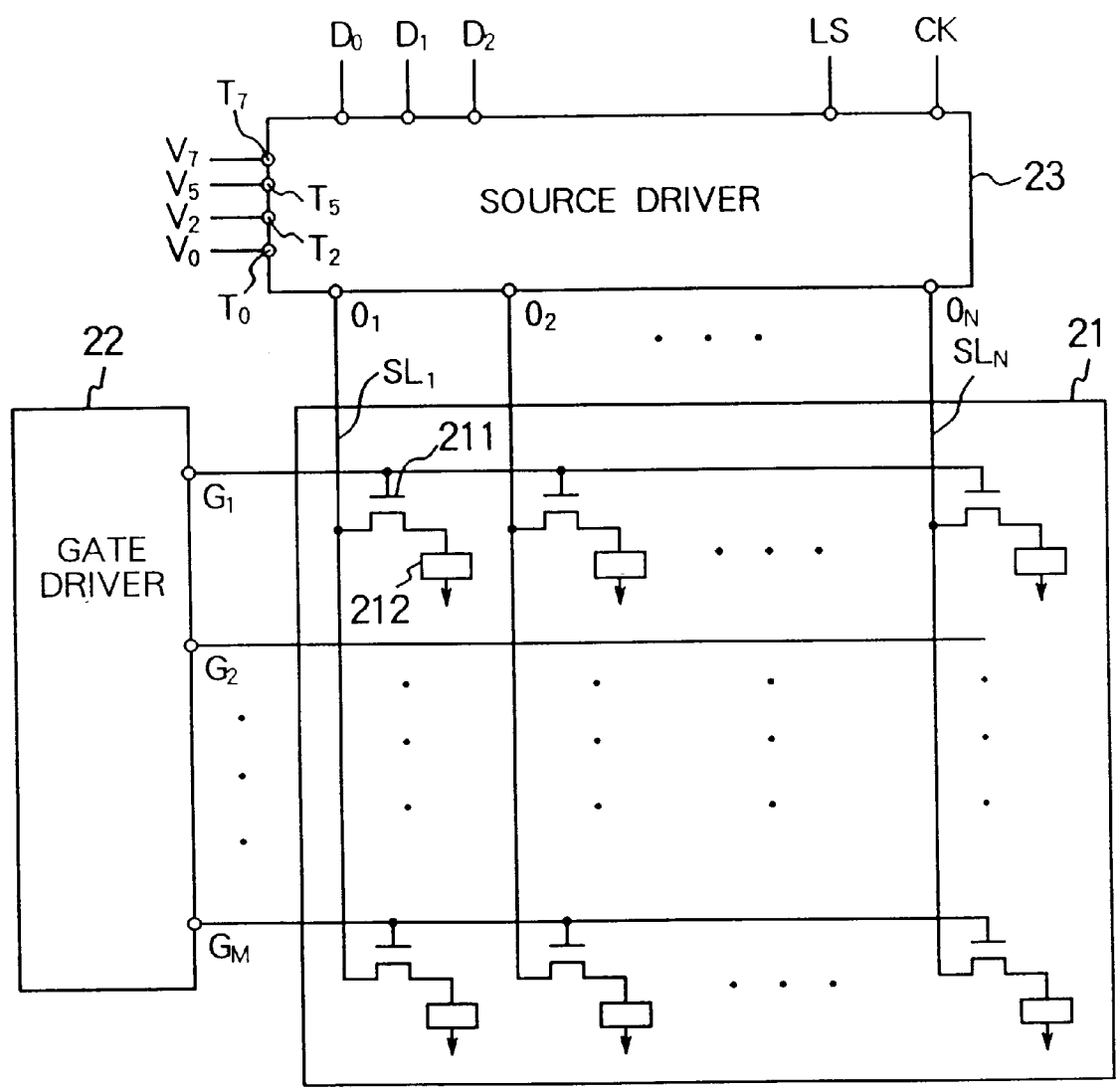
FIG. 2 is an arrangement of a TFT liquid crystal display system.
Figure 3:
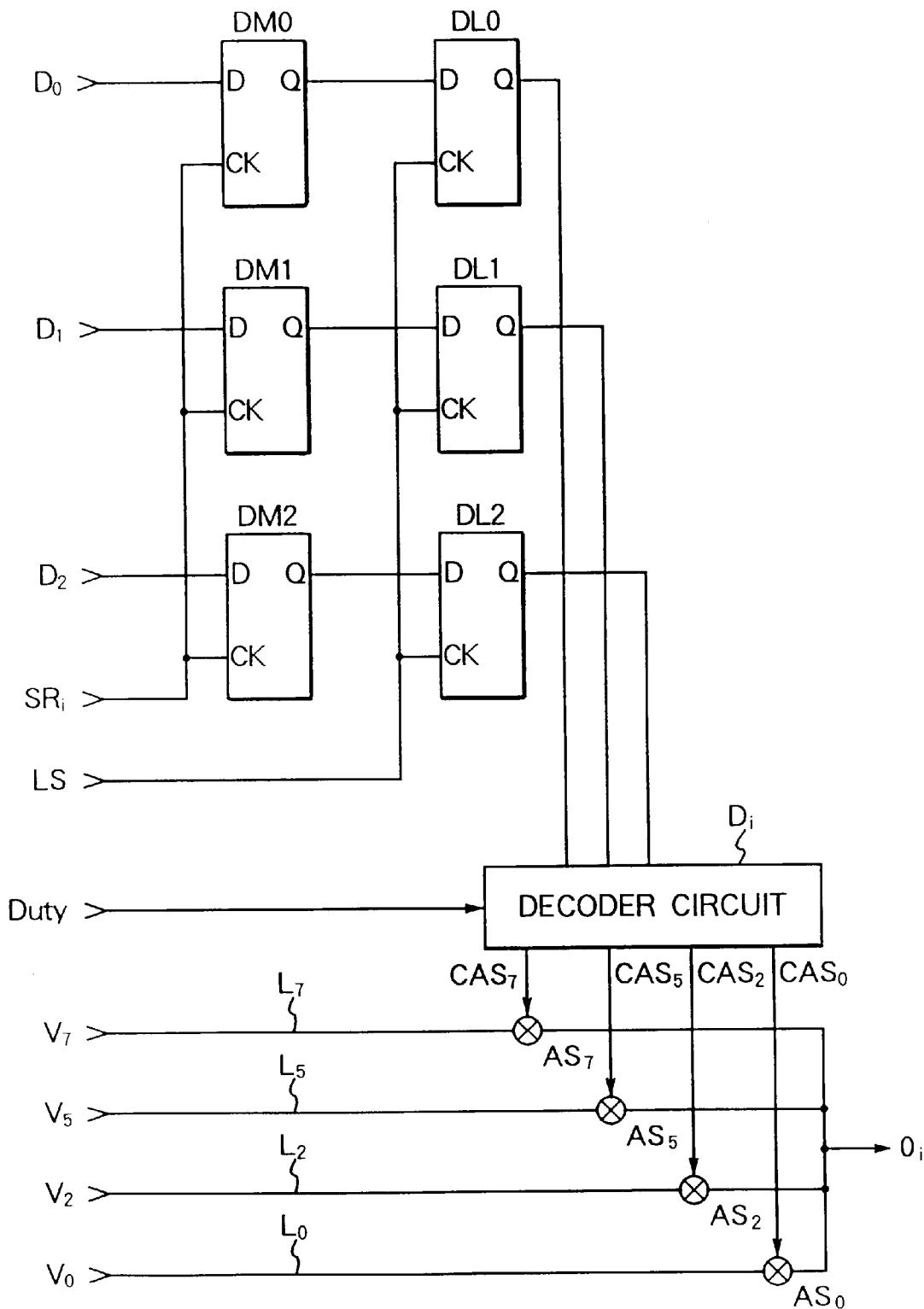
FIG. 3 is an internal arrangement of a conventional source driver.
Figure 4:
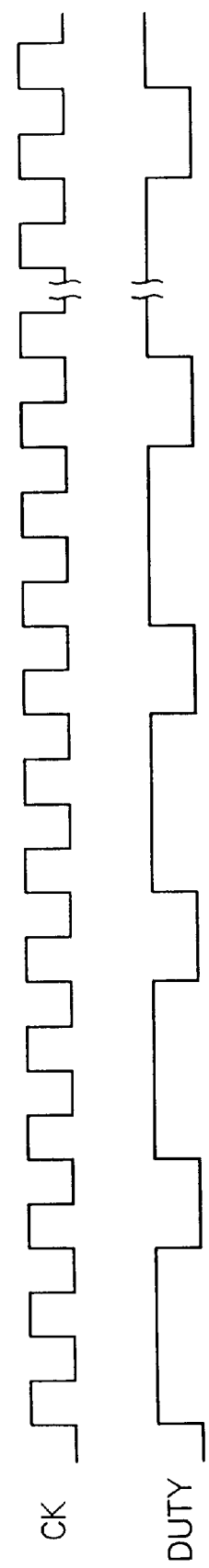
FIG. 4 is a waveform of Duty signal shown in FIG. 3.
Figure 5:
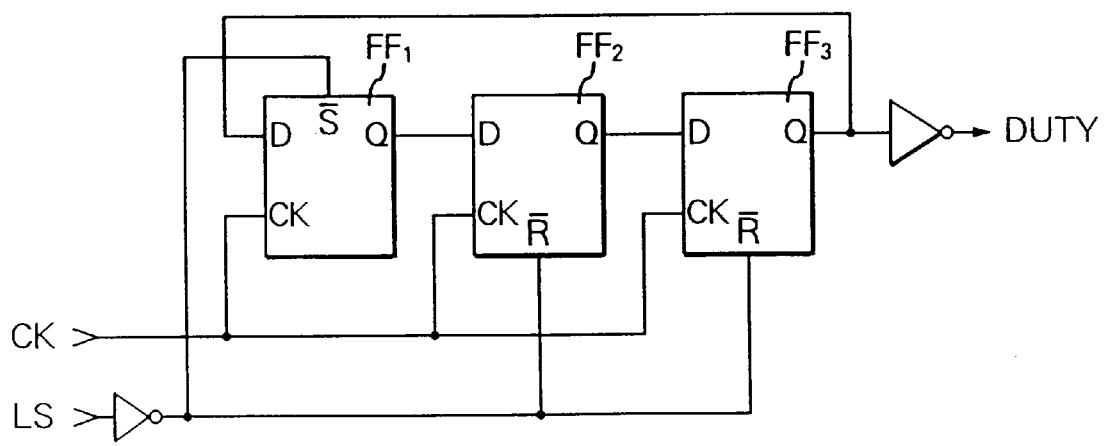
FIG. 5 is an arrangement of Duty signal generator circuit.
Figure 6:
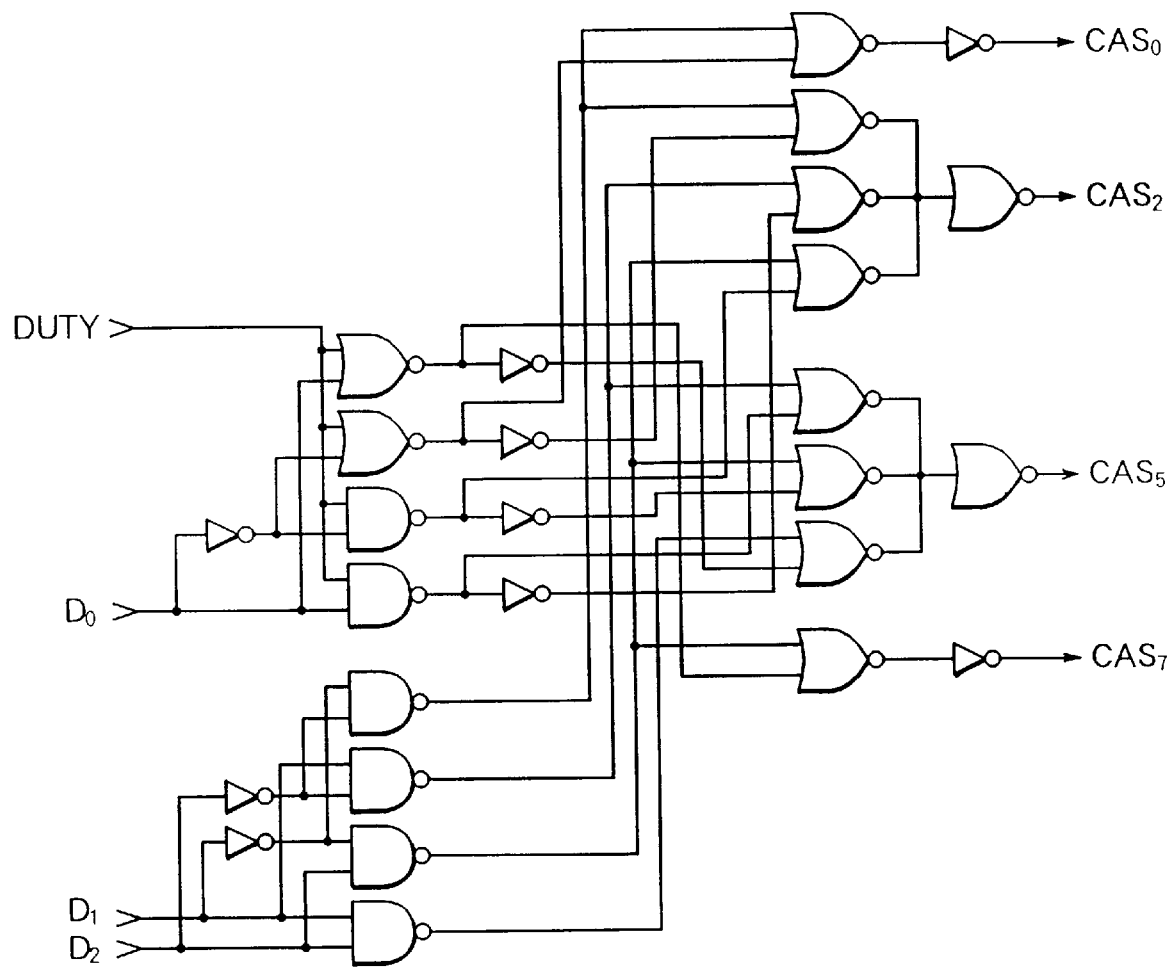
FIG. 6 is an internal arrangement of decoder circuit shown in FIG. 3.
Figure 7:
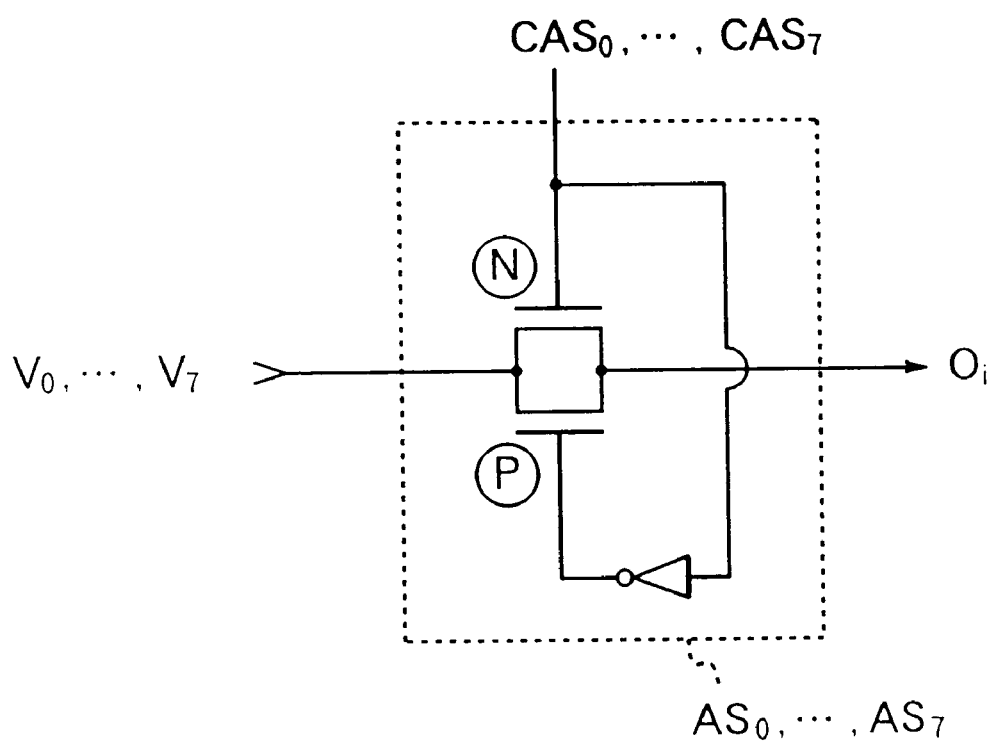
FIG. 7 is an arrangement of analog switch.
Figure 8:
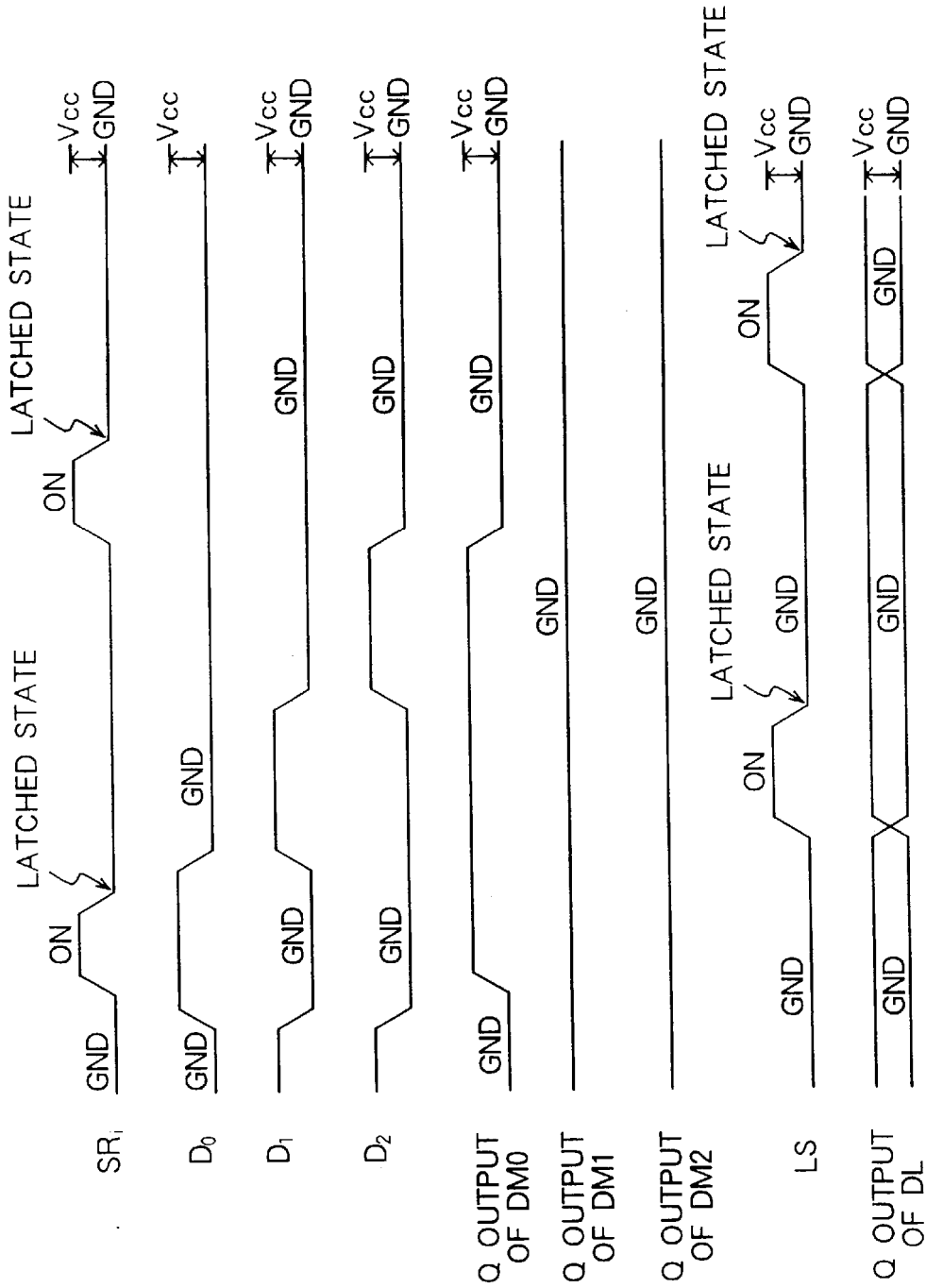
FIG. 8 includes signal waveforms for explaining the operation of source driver.

FIG. 1 shows an internal arrangement of source driver IC of a TFT liquid crystal display which is an embodiment of the present invention. The circuit of FIG. 1 is a portion corresponding to one output terminal, and the source driver IC of the embodiment has similar circuits of N (the number of output terminals) in parallel therein.

$D_0$, $D_1$ and $D_2$ are display data, $DM_0$, $DM_1$ and $DM_2$ are data memory circuits which take in display data at the timing of clock signals SRi (i=1, . . . N), and store them; $DL_0$, $DL_1$ and $DL_2$ are display latch circuits which latch the output of data memory circuit at the timing of horizontal synchronizing signal LS; $V_0$, $V_2$, $V_5$ and $V_7$ are reference power supplies; $L_0$, $L_2$, $L_5$ and $L_7$ are supply lines to the reference power supplies $V_0$, $V_2$, $V_5$ and $V_7$, respectively, $AS_0$, $AS_2$, $AS_5$ and $AS_7$ are analog switches inserted in the respective power supply lines; Di is a decoder circuit which outputs signals $CAS_0$, $CAS_2$, $CAS_5$ and $CAS_7$ for controlling opening and closing the analog switches $AS_0$, $AS_2$, $A_5$ and $AS_7$ based on the output of the display latch circuits $DL_0$, $DL_1$ and $DL_2$ as well as the signal Duty with duty ratio 1:2 and an analog switch turning off signal TI, and Oi is an output. The clock signals SRi are sequentially phase shifted timing signals output from a shift register contained in the source driver IC.

The analog switch turning off signal TI is input in the decoder circuit Di, and that all the analog switches $AS_0$, $AS_2$, $AS_5$ and $AS_7$ are turned off based on said signal TI after a predetermined period of time expires.

Figure 9:
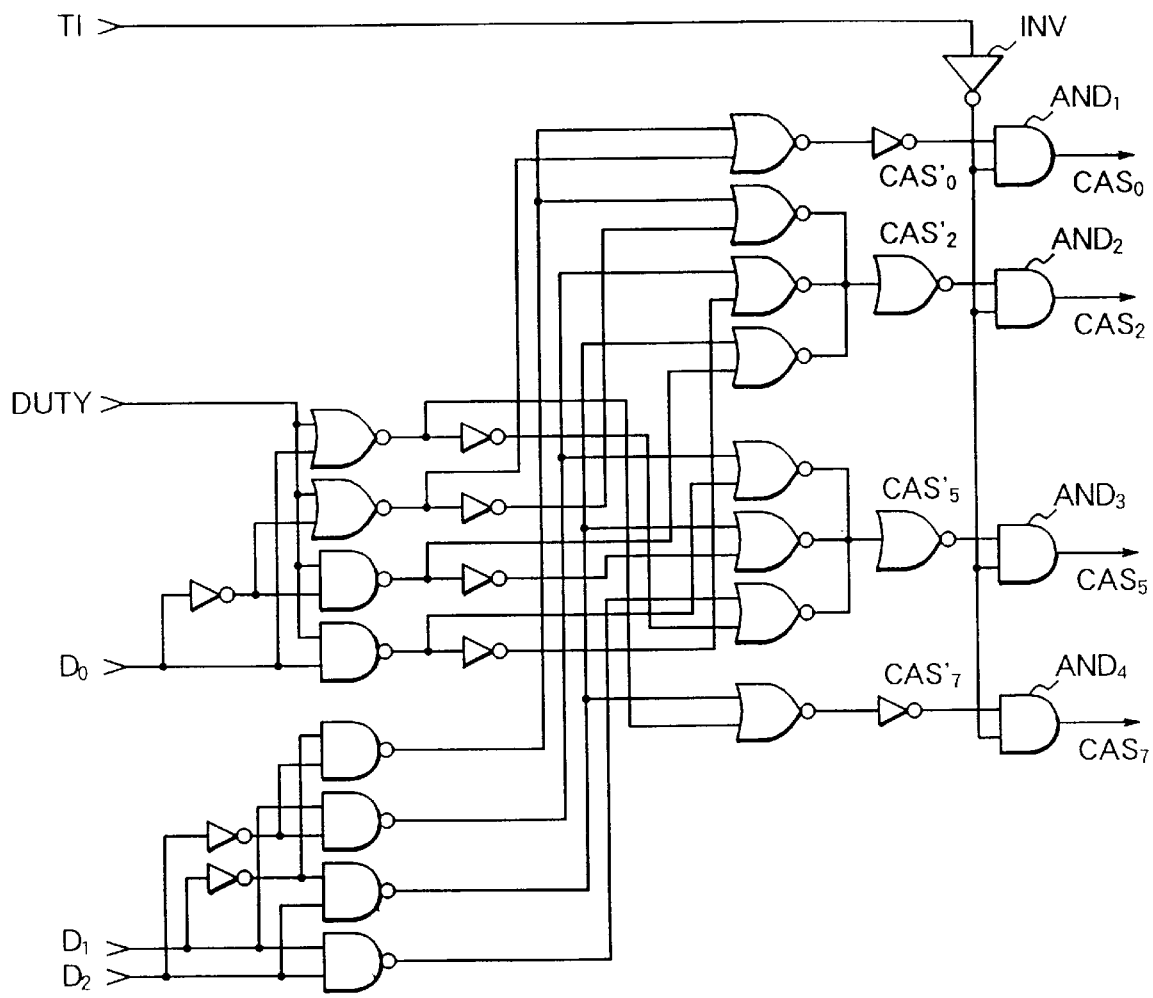
FIG. 9 is an internal arrangement of the decoder circuit shown in FIG. 1.

An example of arrangement of decoder circuit Di is shown in FIG. 9. In addition, the circuits for generating the signal Duty with duty ratio 1:2 and the analog switch signal TI are shown in FIG. 10, Furthermore, waveforms of the signal Duty, the signal TI, and the analog switch control signals $CAS_0$, . . . , $CAS_7$ are shown in FIG. 11.

Figure 10:
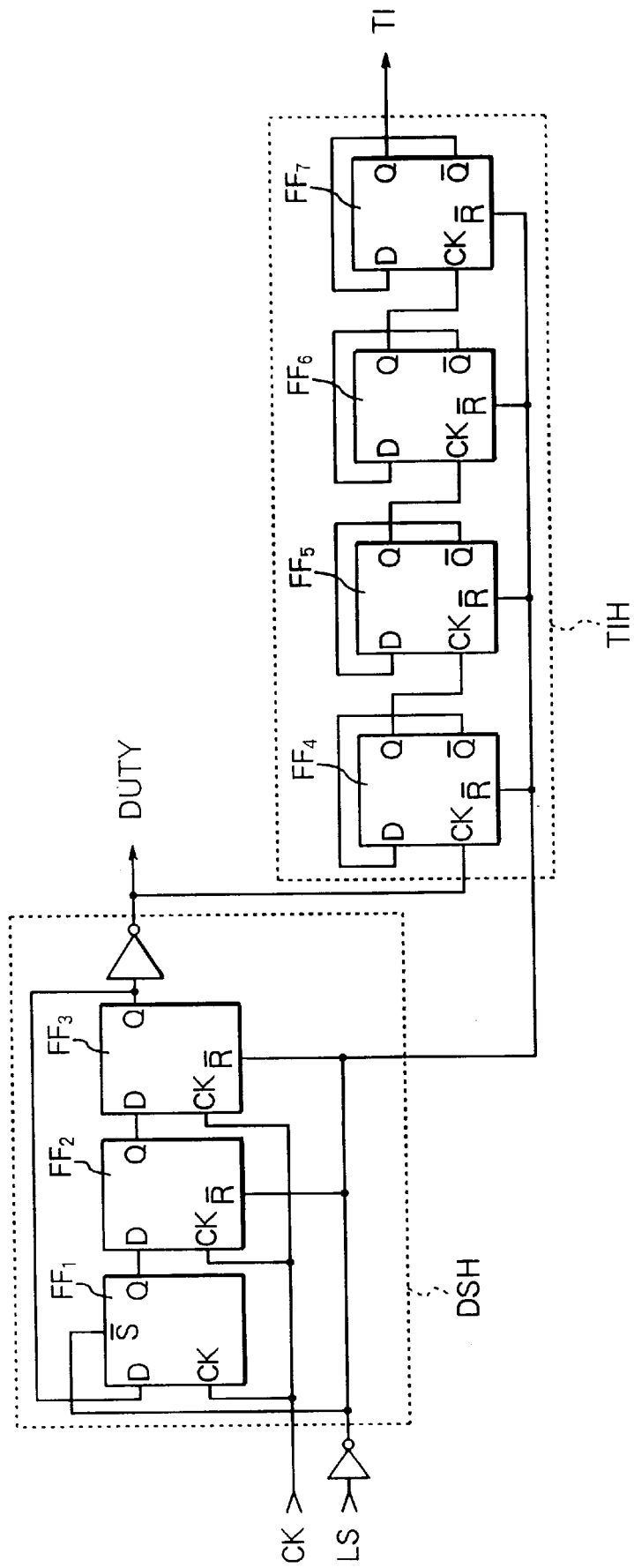
FIG. 10 includes arrangements of the Duty signal generator circuit and a TI signal generator circuit.

As shown in FIG. 10, the circuit DSH for generating the signal Duty with duty ratio 1:2 has the same arrangement as in the prior art. It uses three D-type flip-flops $FF_1$, $FF_2$ and $FF_3$ to produce and output the signal Duty with duty ratio 1:2 from the base clock CK and the horizontal synchronizing signal LS. In addition, the circuit TIH for generating the analog switch turning off signal TI consists of a binary counter constituted by four D-type flip-flops $FF_4$, $FF_5$, $FF_6$ and $FF_7$. It is designed that the signal Duty is fed to the clock input of the flip-flop $FF_4$ which is the first stage of the binary counter, and that all flip-flops are reset by the horizontal synchronizing signal LS. Accordingly, the signal TI which is its output rises from "L" to "H" at the moment when 16 Duty signals are generated after resetting by the horizontal synchronizing signal LS.

The circuit DSH for generating the signal Duty with duty ratio 1:2 and the circuit TIH for generating the analog switch turning off signal TI are provided in the source driver IC of the embodiment.

As shown in FIG. 9, the decoder circuit of this embodiment has the same arrangement as in the conventional decoder circuit added with AND gates $AND_1$, $AND_2$, $AND_3$ and $AND_4$, as well as an invertor INV. It outputs AND signals between an inverted signal of the analog switch turning off signal TI, and respective analog switch control signals $CAS_0'$, $CAS_2'$, $CAS_5'$ and $CAS_7'$ which are produced based on the display data Dot $D_1$ and $D_2$ and the signal Duty, as $CAS_0$, $CAS_2$, $CAS_5$ and $CAS_7$, respectively.

Therefore, at the moment when 16 Duty signals are counted from the time when the display data is fed to the decoder circuit by the horizontal synchronizing signal LS, all the analog switch control signals $CAS_0$, . . . , $CAS_7$ become 0, and all analog switches $AS_0$, . . . , $AS_7$ are turned off. This prevents unnecessary oscillation voltage from being applied to the liquid crystal display so that unnecessary power consumption is prevented.

Although the above embodiment is for a case to display eight gradations, it is a matter of course that power consumption can be reduced without degrading the display quality even for the source driver IC for displaying 16, 64, or even 256 gradations by turning off the analog switches for the source driver IC when an oscillation voltage is applied in the number of times corresponding to the characteristics the liquid crystal display.

In addition, although, in the above embodiment, the analog switches are turned off after oscillation voltage is applied for a duration of 16 cycles of the signal Duty with duty ratio 1:2, the duration (number of cycles) is sufficient to be more than a duration (number of cycles) which is required at minimum for the respective liquid crystal elements to reach-a desired DC voltage according to the characteristics of the liquid crystal display. In addition, the TI signal may be designed to be input externally to the source driver IC (for example, from a microcomputer or a display controller).

Furthermore, whether the TI signal is internally generated, or externally input, it may be allowed to make the duty ratio variable so that it can be adjusted according to the characteristics of liquid crystal display or the like.

Examples of an arrangement where the duty ratio of TI signal is made variable will be explained in the following.

Possible arrangements include, for example, an arrangement in which the TI signal generator circuit TIH has the flip-flops in the number with margin, and a non-volatile memory using fuse elements is provided in the source driver IC, wherein a predetermined value corresponding to the characteristics of liquid crystal display is set by selectively melting the respective fuse elements, and the TI signal is generated when the count value of the counter constituting the TI signal generator circuit reaches the predetermined value, and an arrangement in which the predetermined value is set in the counter as the initial value by the horizontal synchronizing signal.

Furthermore, an arrangement may be also possible in which a register is provided in the source driver IC, a predetermined value is written in the register from a microcomputer constituting the equipment when the power is turned on, and the predetermined value stored in the register is used as in the above.

Still further, an arrangement may be also possible in which a signal which is different from the Duty signal and synchronizes the base clock is used as the count clock signal for the counter constituting the analog switch turning off signal generator circuit, and the cycle of the signal is made variable.

As described in detail in the above, according to the present invention, supply of the oscillation voltage can be stopped at the moment when the voltage applied to the respective liquid crystal elements of the liquid crystal display reaches a desired DC voltage corresponding to the display data. Thus, it becomes possible to reduce the power consumption of the liquid crystal display without degrading the display quality so that it can meet the demand to extend the battery operation time of portable equipment mounted with a liquid crystal display. The present invention is particularly effective for equipment using a liquid crystal display with a large screen and high definition having a number of liquid crystal drivers, and can significantly extend the battery operation time.

Many widely different embodiments of the present invention may be constructed without departing from the sprit and scope of the invention. - It should be understood that the present invention is not limited to the specific embodiments described in the specification, except as defined in the appended claims.

What is claimed is:

1. A liquid crystal display driver which continuously supplies, to a liquid crystal display, the potential of one reference power supply selected from a plurality of reference power supplies according to display data, said liquid crystal display driver, comprising:

a plurality of input terminals to which said plurality of reference power supplies are connected;

an output terminal connected to said liquid crystal display;

analog switches inserted between said respective input terminals and said output terminal;

a control circuit outputting a control signal to said analog switches to control said analog switches to be ON or OFF based on said display data; and a counter circuit outputting a signal to the control circuit for turning off all said analog switches when a content of counts in said counter circuit reaches a predetermined value.

2. The liquid crystal display driver claimed in claim 1, wherein said predetermined value is variable.

3. The liquid crystal display driver claimed in claim 1, wherein a cycle of a count clock signal in said counter circuit is variable.

4. A liquid crystal display driver which alternately outputs, to a liquid crystal display, the potentials of two reference power supplies selected from a plurality of reference power supplies according to display data, said liquid crystal display driver comprising:

a plurality of input terminals to which said plurality of reference power supplies are connected;

an output terminal connected to said liquid crystal display;

analog switches inserted between said respective input terminals and said output terminal;

a control circuit outputting a control signal for alternately turning on two corresponding analog switches based on said display data;

a counter circuit counting a number of periodic repetitions when said two analog switches are alternately turned on; and a circuit outputting a signal for turning off all said analog switches based on a signal indicating that a content of counts in said counter circuit reaches a predetermined value.

5. The liquid crystal display driver claimed in claim 4, wherein said predetermined value is variable.

6. A liquid crystal display driver which outputs, to a liquid crystal display, the potentials of at least two reference power supplies selected from a plurality of reference power supplies according to display data in a time divisional manner, said liquid crystal display driver comprising:

a plurality of input terminals to which said plurality of reference power supplies are connected;

an output terminal connected to said liquid crystal display;

analog switches inserted between said respective input terminals and said output terminal;

a control circuit outputting a control signal to said analog switches to control said analog switches to be ON or OFF based on said display data; and a counter circuit outputting a signal to the control circuit for turning off all said analog switches when a content of counts in said counter circuit reaches a predetermined value.

7. The liquid crystal display driver claimed in claim 6, wherein said predetermined value is variable.

8. The liquid crystal display driver claimed in claim 6, wherein a cycle of a count clock signal in said counter circuit is variable.

* * * * *